United States Patent [19]

Nagakusa et al.

[11] Patent Number: 5,295,853
[45] Date of Patent: Mar. 22, 1994

[54] MECHANISM FOR REMOVABLY MOUNTING DUT BOARD ON TEST HEAD

[75] Inventors: Keiichi Nagakusa; Tetsuya Shiraishi; Takeshi Tamura; Shinichi Saito, all of Tokyo, Japan

[73] Assignee: Hewlett-Packard Company, Palo Alto, Calif.

[21] Appl. No.: 846,815

[22] Filed: Mar. 6, 1992

[30] Foreign Application Priority Data

Mar. 11, 1991 [JP] Japan .................. 3-070635

[51] Int. Cl.$^5$ ........................... H01R 13/62
[52] U.S. Cl. .................. 439/330; 439/311; 324/158 F
[58] Field of Search ............ 439/310, 311, 314, 315, 439/330, 329, 331, 332, 333, 338, 372; 324/158 F, 158 P

[56] References Cited

U.S. PATENT DOCUMENTS

| | | | |
|---|---|---|---|
| 3,960,423 | 6/1976 | Weisenburger | 439/331 |
| 4,695,258 | 9/1987 | Hanson et al. | 439/329 |
| 4,975,639 | 12/1990 | Hiwada et al. | 324/158 |
| 5,051,689 | 9/1991 | Hiwada et al. | 324/158 |
| 5,055,779 | 10/1991 | Kershner et al. | 324/158 F |
| 5,068,601 | 11/1991 | Parmenter | 324/158 F |

FOREIGN PATENT DOCUMENTS

62-288191 11/1987 Japan .

OTHER PUBLICATIONS

"Dynamic Test System for High Speed Mixed Signal Devices", Kiyo Hiwada, et al., 1987 International Test Conference, Sep. 1-3, 1987, IEEE Catalog No. 87CH2347-2.

S. M. Jensen (card-to-board planar connector system; Feb. 1970, vol. 12, No. 9, pp. 1394 & 1395).

*Primary Examiner*—Daniel W. Howell
*Assistant Examiner*—Hien D. Vu

[57] ABSTRACT

A cam mechanism is provided in a DUT board mounting portion of a test head which includes a cam shaft having a guide pin connected to an actuator and a driven ring having a sloped groove along which the guide pin is guided, and a second guide pin provided on an outer cylindrical surface of the driven ring which is guided along a substantially L-shaped cam groove formed in a cylindrical opening of the DUT board mounting portion of the test head. When the second guide pin is located on a horizontal portion of the L-shaped cam groove, the driven ring is inhibited from moving downwardly but is rotated together with the cam shaft so that an engaging member of the driven ring is caused to engage with the DUT board. When the second guide pin reaches a vertical portion, only the cam shaft is rotated, and the driven ring moves downwardly along the vertical portion of the L-shaped groove to urge the DUT board assembly against contact probes on the test head assembly.

8 Claims, 7 Drawing Sheets

MECHANISM FOR REMOVABLY MOUNTING DUT BOARD ON TEST HEAD

FIELD OF THE INVENTION

This invention relates to a mechanism for a freely movable DUT mounting board on a test head which is an interface between a test system for examining semiconductor elements and a device under test (DUT).

BACKGROUND OF THE INVENTION

A test head assembly for a DUT board has a number of pin boards, each of which is equipped with a contact probe for contacting a DUT (device under test) board. A DUT is mounted thereon through the contact probes. In order to implement complete contact between the test head and the DUT board, the contact probes are supported by springs in such a manner as to be projected from and retracted into the pin board. The DUT board is fixedly mounted on the test head while pressed by the contact probes which are urged by the springs.

FIG. 1 shows a conventional mounting mechanism for mounting the DUT board on the test head. A docking plate 20 having a square-frame shape is provided on the upper surface of a DUT board mounting portion 1a of the test head 1, and a pair of cams 21 are mounted on the opposite sides of the docking plate 20. The DUT board 10 is fixed to a square supporter 22 at several points thereof in such a manner as to be removably mounted on the square supporter 22. The square supporter 22 is provided with cam followers 23 engagable with the cams 21, and the cam followers 23 are downwardly insertable into the cams 21. Upon rotation of the cams 21 by operating a lever 21a, the cam followers 23 are brought into engagement with cam grooves of the cams 21, and the supporter 22 is downwardly fastened along slopes of the grooves. The cams 21 are linked with each other through a wire 24, and thus operated interlockingly with each other.

However, the above conventional mounting mechanism has the following disadvantages. First, the supporter 22 having the cam followers 23 is indispensable for the mounting mechanism. In addition, a DUT board must be mounted and removed from the supporter 22 one by one for each DUT board 10 so that the operation is not efficiently carried out. Secondly, the cam 21, the lever 21a and the wire 24 project from the upper surface of the test head 1, and the projection of these elements restricts the access area. Likewise, the cam followers 23 project from the side surfaces of the supporter 22 and thus also restrict an access area. Thirdly the supporter 22 is urged by a force directed in a horizontal direction through the rotation of the cams 21, and this urging force causes a dislocation of the DUT board 10.

This invention is made to overcome the above disadvantages of the prior art, and an object of this invention is to provide a mechanism for removably mounting a DUT board in which a mounting and removing work or an exchange work of the DUT board is easily carried out, and the DUT board is stably mounted.

SUMMARY OF THE INVENTION

In order to attain the above and other objects, according to one aspect of this invention, a mechanism for a freely removable DUT mounting board on a test head is characterized in that:

(1) a rotatable cam mechanism is provided in a cylindrical opening formed in a DUT board mounting portion of the test head;

(2) the cam mechanism includes a cam shaft having a guide pin projected from the outer peripheral surface thereof and a cylindrical driven ring freely movably engaged with said cam shaft;

(3) the driven ring includes an engaging member to be engaged with the DUT board at an upper portion thereof, and a sloped guide groove for guiding the guide pin of the cam shaft along the outer peripheral surface of the driven ring to move the driven ring upwardly and downwardly in association with rotation of the cam shaft;

(4) the driven ring further includes a guide pin projected from the outer peripheral surface thereof, and a cam groove for guiding the guide pin of the driven ring is formed at an upper end portion on the inner wall of the cylindrical opening of the test head, the cam groove comprising a horizontal portion and vertical portion; and (5) the DUT board is provided with an engaging portion which is engaged with the engaging member of the driven ring through rotation of the driven ring.

The rotatable cam mechanism may be disposed in each of cylindrical openings formed at plural corners of the DUT board mounting portion, and a belt may be suspended among pulleys provided to the cam shafts to actuate the cam mechanisms in synchronism with one another.

Further, the mechanism thus constructed may further include a positioning member provided to the DUT board mounting portion for positioning and supporting pin boards installed in the test head in the neighborhood of contact proves which are contacted with the DUT board. The positioning member is formed with an opening, and the cam mechanism is rotatably disposed in the opening.

Still further, in the mechanism as described above, the DUT board may be formed with a through hole into which the engaging member of the driven ring is inserted, and an engaging surface engagable with the engaging member may be formed on the inner wall of the through hole.

According to another aspect of this invention, a mechanism for freely removable mounting a DUT board on a test head is characterized in that:

(1) a rotatable cam mechanism is provided in a cylindrical opening formed in a DUT board mounting portion of the test head;

(2) the cam mechanism includes a cam shaft comprising a cylindrical hollow portion having a guide pin projected from the inner peripheral surface thereof; and (3) The DUT board is provided with a cylindrical portion which is insertable into the cylindrical hollow portion of the cam shaft, the cylindrical portion having a sloped groove formed along the outer peripheral surface thereof for guiding the guide pin of the cylindrical hollow portion, and the sloped groove being downwardly opened.

DETAILED DESCRIPTION OF THE PREFERRED EMBODIMENT

Preferred embodiments of this invention will be described with reference to the accompanying drawings. FIG. 2 to 6.

Figure 6:
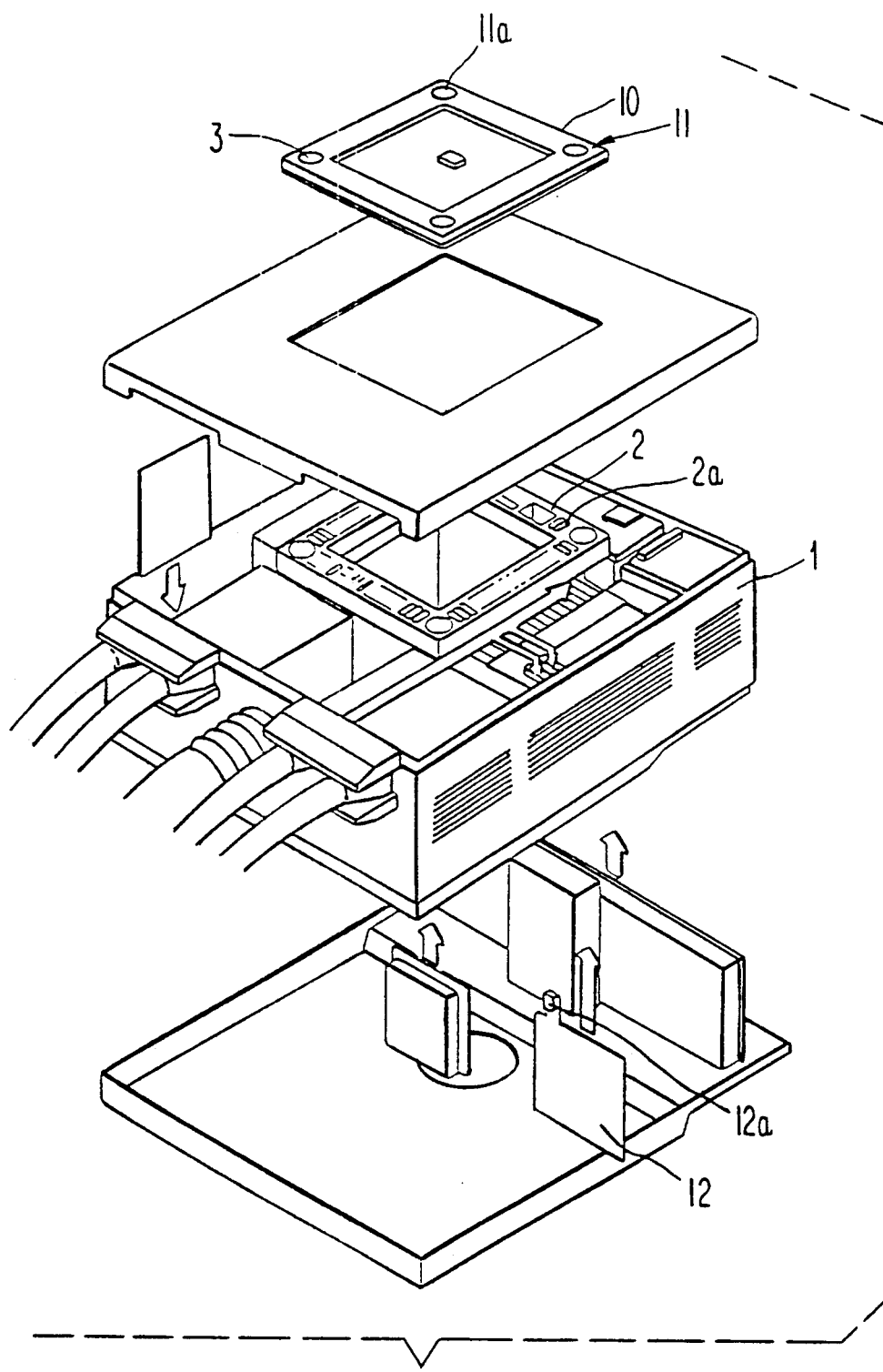
FIG. 6 is an exploded perspective view of a test head.

In FIG. 6, the DUT board mounting mechanism of this embodiment has a square-frame shaped positioning member 2 having a size corresponding to that of a DUT board 10. The positioning member 2 serves to position and support a number of pin boards 12 which are installed in the test head 1, and has a number of positioning holes 2a for supporting peripheral portions of contact probes 12a which are projectingly mounted on the upper surfaces of the positioned pin boards 12. The contact probes 12a are projectably and retractably supported similarly in the conventional DUT board mounting mechanism. The DUT board 10 is removably mounted on the positioning member 2 while pads provided on the inner surface of the DUT board 10 are brought into contact with the contact probes 12a, thereby enabling a test or measurement of the DUT.

Figure 1:
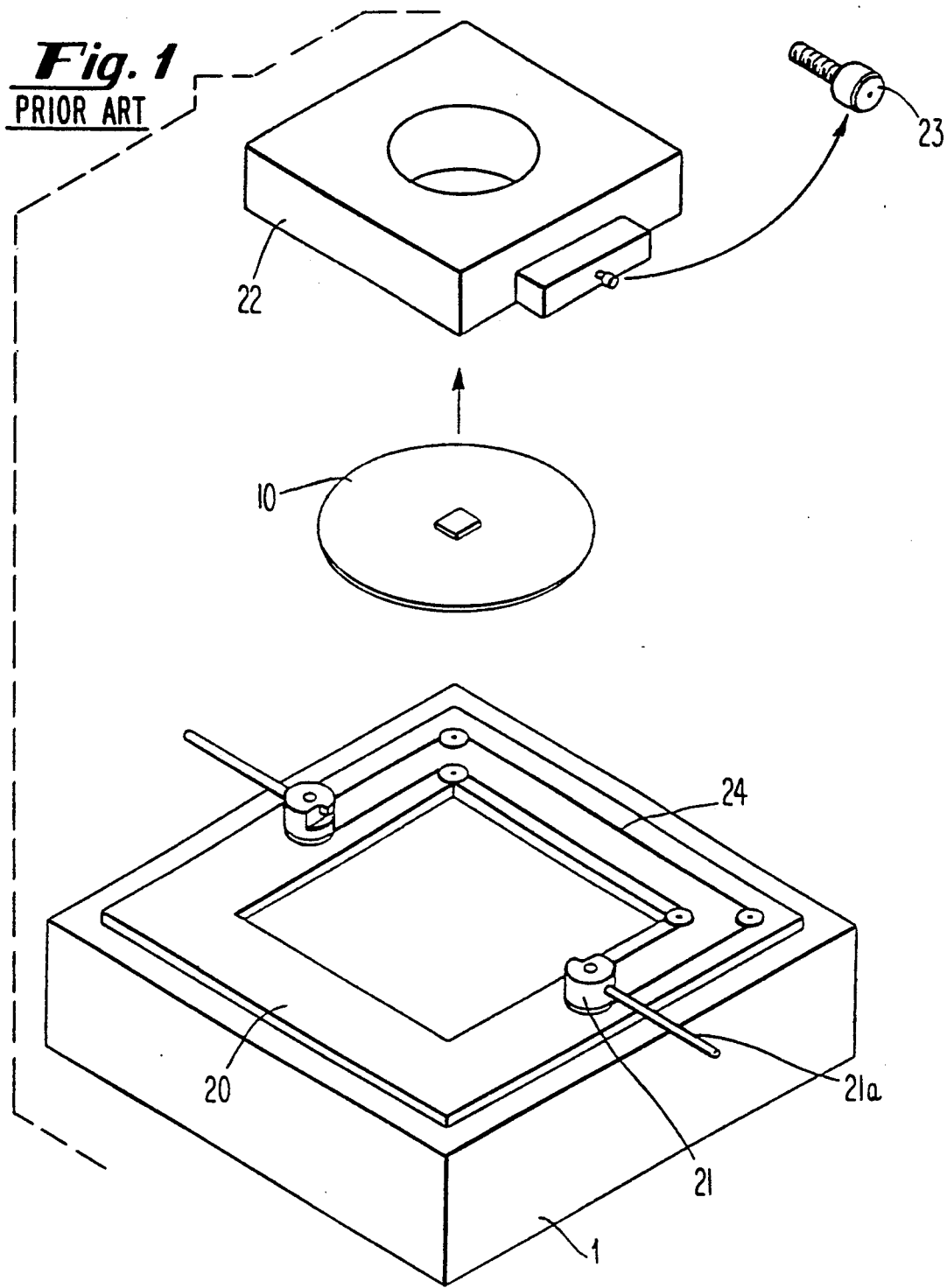
FIG. 1 is a perspective view of a conventional DUT board mounting mechanism.
Figure 2:
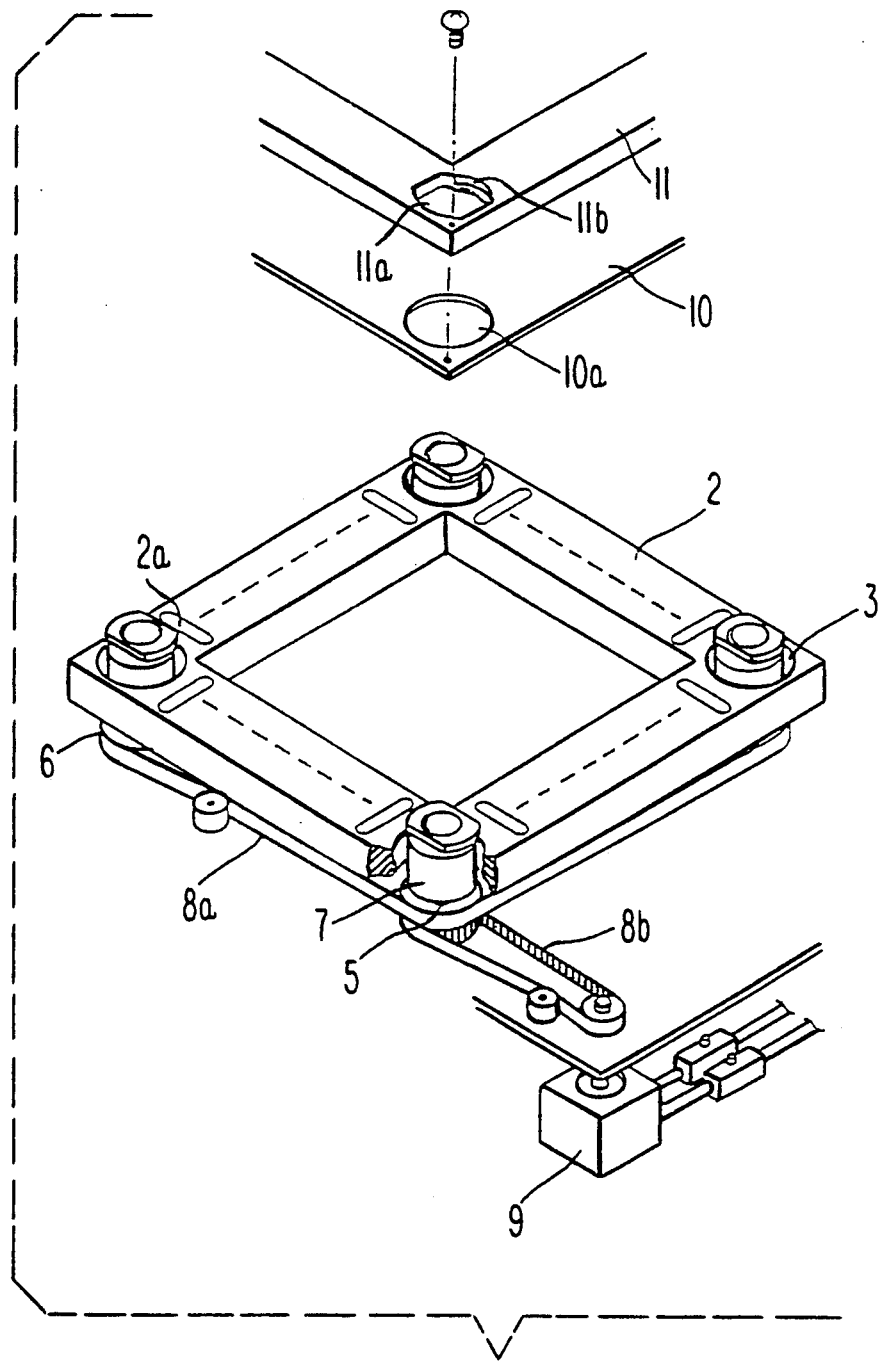
FIG. 2 is a perspective view of a first embodiment of the DUT board mounting and removing mechanism according to this invention.

Referring to FIG. 2, a cylindrical opening 3 is formed at each of the four corners of the positioning member, and a cam mechanism of this embodiment is disposed in each cylindrical opening 3. The cam mechanisms are linked with one another by a timing belt 8a and commonly driven by a timing belt 8b of an actuator 9. Still referring to FIG. 2, each cam mechanism includes a cam shaft 5 having a pulley 6 at the lower end thereof, and a freely movable cylindrical driven ring 7 which is freely movable supported on the cam shaft 5. The cam shaft 5 is driven by the pulley 6 and the timing belts 8a and 8b. This rotational force is transmitted to the driven ring 7 to mount the DUT board 10 on the test head 1 in a fixed position.

Figure 3:
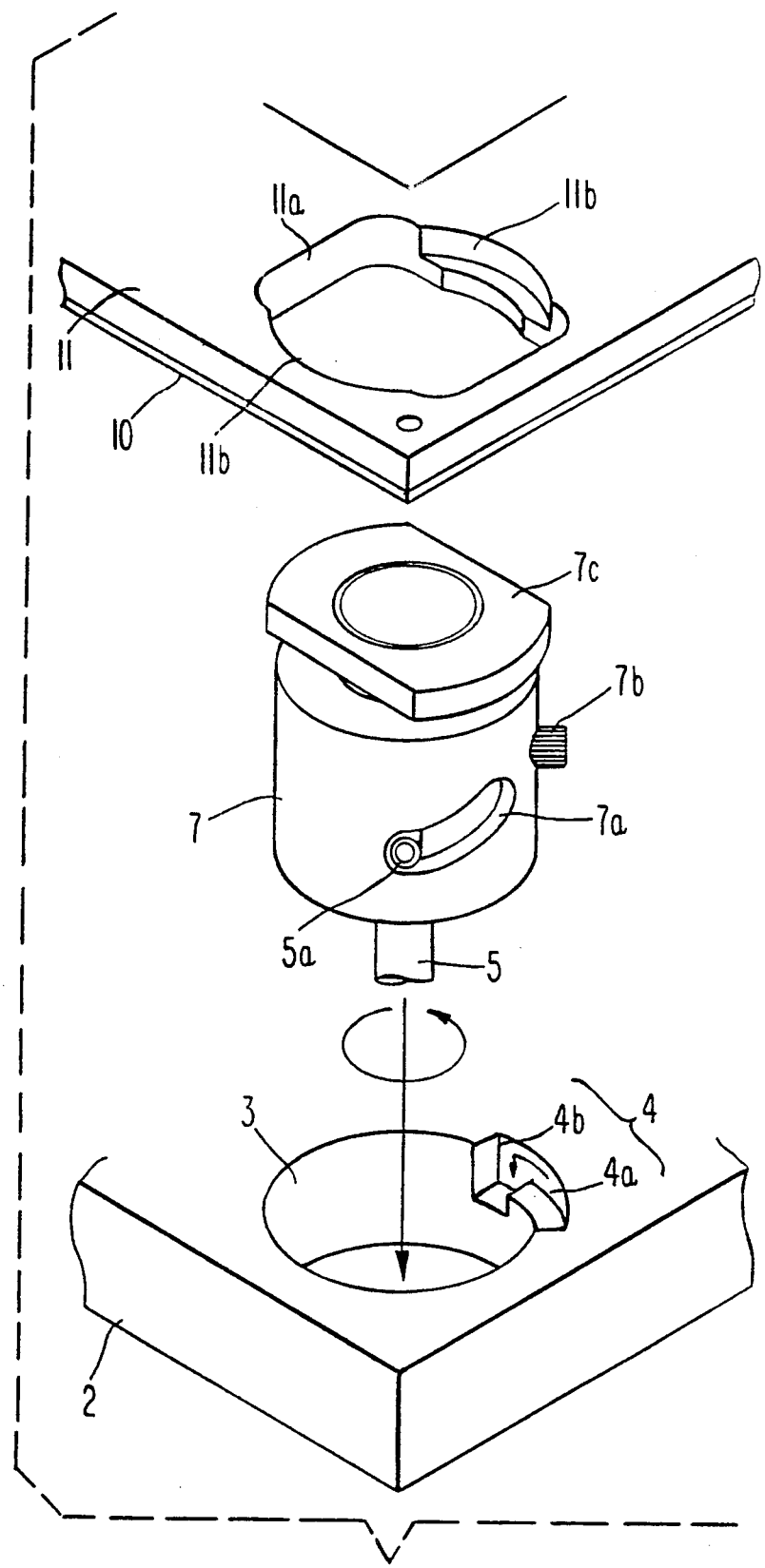
FIG. 3 is an enlarged exploded perspective view of a cam mechanism used in the embodiment of FIG. 2.

The mounting operation of the DUT board 10 on the test head 1 will be described in more detail. Referring to FIG. 3, the cam shaft 5 is provided with a guide pin 5a projected from the outer peripheral surface thereof, and the driven ring 7 is provided with a sloped groove 7a for guiding the guide pin 5a along the peripheral surface thereof. The sloped groove 7a is formed at a predetermined angle along the peripheral surface of the driven ring 7. Therefore, upon rotation of the cam shaft 5, because vertical motion of the cam shaft 5 is restricted and inhibited, the driven ring 7 is forced to move in the vertical direction. A moving stroke of the driven ring 7 is determined by the length and inclination angle of the sloped groove 7a in an initial state. The driven ring 7 downwardly moves when the cam shaft is counterclockwise rotated as indicated by an arrow of FIG. 3. The driven ring 7 had an engaging member 7c at the upper end portion thereof. The engaging member 7c has a shape which is obtained by cutting off both sides of a disk in parallel, and is integrally rotatable with the driven ring 7.

Figure 5A:
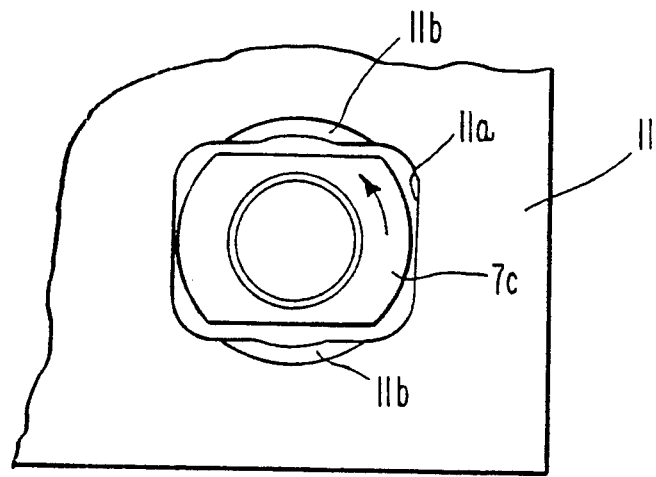
FIG. 5A is a plan view of the cam mechanism which corresponds to FIG. 4A.
Figure 5B:
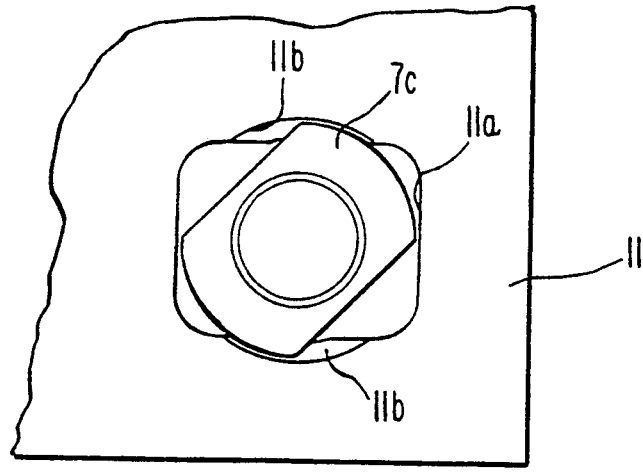
FIG. 5B is a plan view of the cam mechanism which corresponds to FIG. 4B.

Still referring to FIG. 3, the DUT board assembly includes a reinforcing plate 11 which has a square frame shape and is fixedly attached to the DUT board 10 to reinforce the peripheral edges of the DUT board 10. In this embodiment, an aluminum plate of 10 mm in thickness is used as a reinforcing plate. At the four corners of the reinforcing plate 11, the bore 11a engages member 7c of the driven ring 7 and provides surfaces 11b of substantially circular arc shape. The engaging member 7c of the driven ring 7 is inserted through the bore 11a in a positional relationship as shown in FIG. 5A. Then, the engaging member 7c is rotated counter clockwise to engage with the engaging surface 11b as shown in FIG. 5B.

As shown in FIG. 3, the cam groove 4 is provided along the upper inner surface of the cylindrical opening 3 of the positioning member 2, forming a substantially L-shaped section comprising a horizontal portion 4a and a vertical portion 4b. Both horizontal portion 4a and vertical portion 4b of the cam groove 4 are disposed to create an opening on the top surface of positioning member 2. In this embodiment, the cam groove 4 is formed along the periphery of the cylindrical opening over 45°. In addition, a guide pin 7b is projectingly provided to the outer peripheral surface of the driven ring 7, and is guided by the cam groove 4 when the driven ring 7 is inserted in the cylindrical opening 3. The guide pin 7b is located at the right end side of the horizontal portion 4a at the initial state. However, upon counterclockwise rotation of the driven ring 7, the guide pin 7b is first slid along the horizontal portion 4a and then downwardly falls into the vertical portion 4b. Therefore, the driven ring 7 is inhibited from moving downwardly when the guide pin 7b is located on the horizontal portion 4a, but allowed to move downwardly when the guide pin 7b reaches the vertical portion 4b. As the guide pins 5a and 7b may be a shaft pin or a rotatable roller which is freely supported by the shaft pin.

Figure 4A:
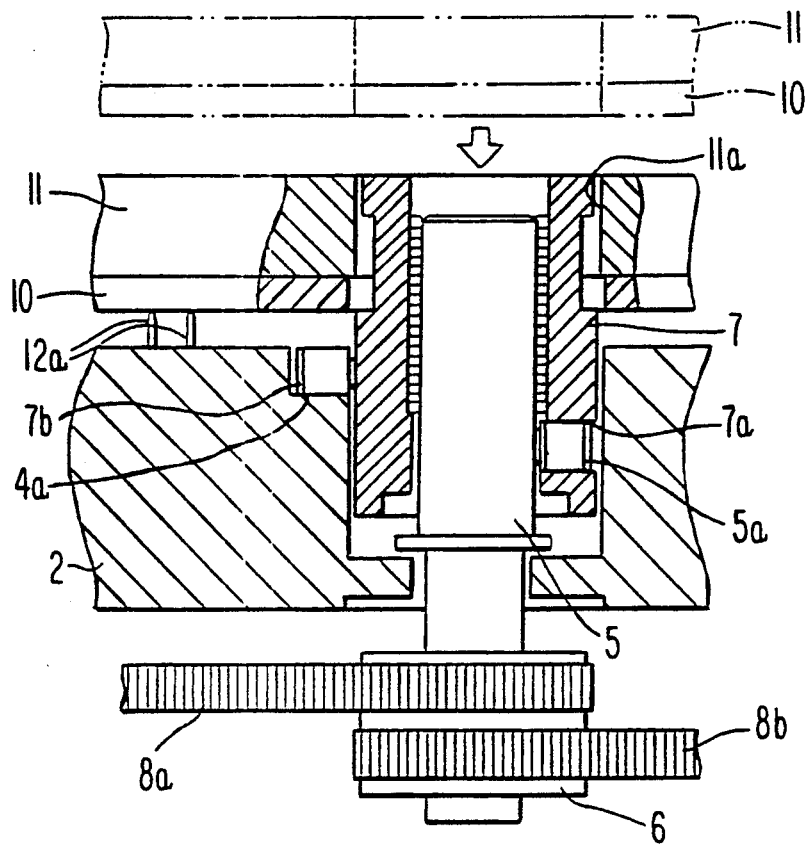
FIG. 4A is a cross-sectional view of the cam mechanism before the DUT board is fixedly mounted on the cam mechanism.

Next, a step flow of mounting the DUT board 10 on the test head 1 in this embodiment will be described hereunder. First, as shown in FIG. 4A, the DUT board 10 having the reinforcing plate 11 secured thereto is mounted on the positioning member 2 while the engaging members 7c are inserted in through bores 10a and 11a at the four corners of the DUT board 10 and the reinforcing plate 11. In this state, the DUT board 10 is supported by a number of the contract probes 12a which are projected from the upper surface of the positioning member 2.

When the actuator 9 (not shown) is energized in this state, each cam shaft 5 is rotated counterclockwise by the timing belts 8a and 8b. The cam shaft 5 is rotated independently of the driven ring 7 to move the driven ring 7 downwardly. That is, the guide pin 5a is about to ascend along the slopped grove 7a of the driven ring 7. However, the driven ring 7 is prevented from being downwardly moved in this state because the guide pin 7b of the driven ring 7 is located on the horizontal portion 4a of the cam groove 4 so that the driven ring 7 is rotated integrally with the cam shaft 5.

Figure 4B:
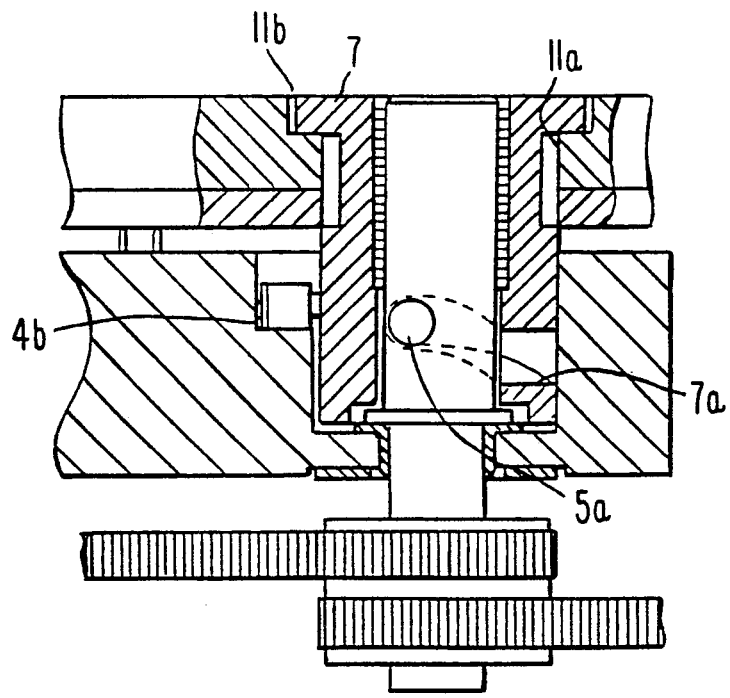
FIG. 4B is a cross-sectional view of the cam mechanism after the DUT board is fixedly mounted on the cam mechanism.

When the driven ring 7 is rotated by approximately 45° integrally with the cam shaft 5, the guide pin 7b of the driven ring 7 reaches the vertical portion 4b of the cam groove 4. The guide pin 7b comes into contact with the inner wall of the vertical portion 4b as shown in FIG. 4B. Therefore, the driven ring 7 is prevented from rotation, but the driven ring 7 can vertically move. In this state, the engaging member 7c of the driven ring 7 reaches a position that the engaging member 7c is engagably supported by the engaging surface 11b as shown FIG. 5B.

When the cam shaft 5 is further rotated while the rotation of the driven ring 7 is prevented, the cam shaft 5 is rotated independently of the driven ring 7 so that the guide pin 5a of the cam shaft 5 slides along the sloped groove 7a to urge the driven ring 7 in the downward direction as in FIG. 3. The driven ring 7 downwardly moves while the guide pin 7b thereof is guided along the vertical portion 4b. This downward movement of the driven ring 7 urges the mounted DUT board 10 against a spring force of the contact probes 12a. These operations are carried out as a series of successive and synchronous operations among the respective cam mechanisms. A removal of the DUT board 10 from the test head 1 is carried out by rotating the cam shaft in the opposite or clockwise direction.

In the above embodiment, the cam mechanism may be disposed in a cylindrical opening which is formed in a chassis of the test head 1, and thus the positioning member 2 is not necessarily required. Further, the cam mechanism is not necessarily required to be disposed at four corners. For example, at least two cam mechanisms may be disposed at opposite positions to enable a stable mounting of the DUT board.

Figure 7:
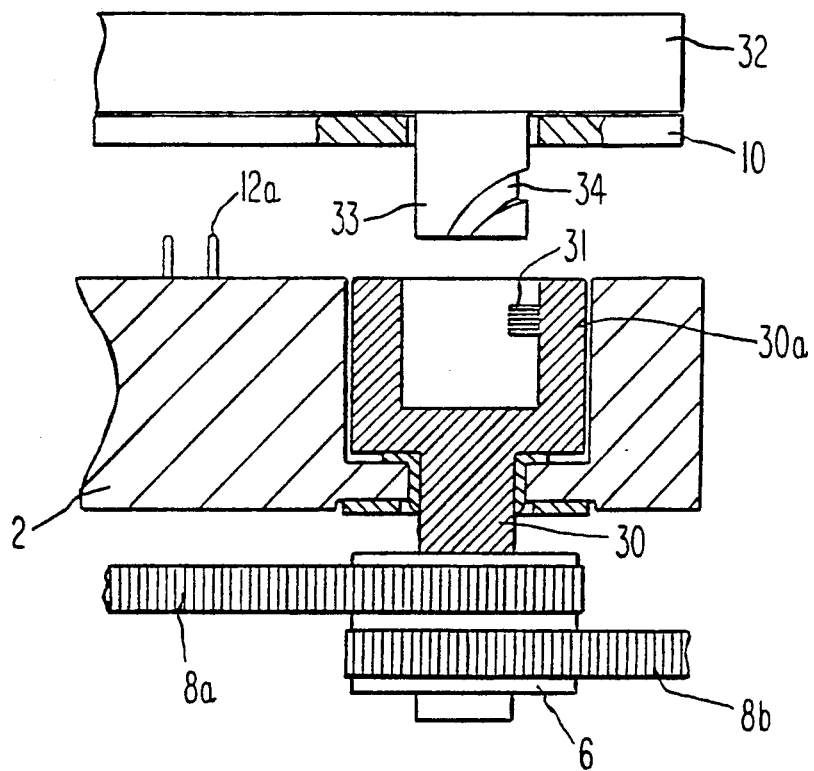
FIG. 7 is a cross-sectional view of another embodiment of the cam mechanism of this invention.

FIG. 7 is a cross-sectional view of a cam mechanism used in another embodiment of this invention. The DUT board mounting mechanism of this invention has substantially the same construction as that of the first embodiment except for the construction of the cam mechanism. Thus, the description of the common portions is eliminated from the following description. In this embodiment, the cam mechanism fitting the cylindrical opening 3 of the positioning member 2 comprises a cylindrical hollow portion 30a at the upper portion of the cam shaft 30. A guide pin 31 is projectingly disposed at the inner surface of the cylindrical portion 30a. In addition, a cylindrical portion 33 fitting to the cylindrical hollow portion 30a is disposed on the bottom surface of the reinforcing plate 32 which is placed on the DUT board 10. A sloped groove 34 is formed along the outer bottom surface of the cylindrical portion 33 so that guide pin 31 is insertable into the groove 34 at an opening at the bottom when the cylindrical portion 33 is inserted into the cylindrical hollow portion 30a. In the DUT board mounting mechanism thus constructed, when the DUT board 10 is mounted on the positioning member 2 while the guide pin 31 of the cylindrical hollow portion 30a is engaged with the groove 34 of the cylindrical portion 33, the actuator 9 (not shown) is energized to rotate the cam shaft 30 through timing belts 8a and 8b. As described above in the first embodiment, the DUT board 10 is fixedly mounted on the test head 1 while urged against the contact probes 12a through the positional relationship between the guide pin 31 and the groove 34.

As described above, according to this invention, most of the DUT board mounting mechanism is not exposed at the upper surface of the DUT board mounting portion, so that the test environment is improved, and positioning accuracy in a plane (horizontal) direction is also improved. In the invention, a special structure or element is not required for the DUT board side, and thus plural reinforcing plates which are manufactured at a low cost may be beforehand secured to the DUT board side. This saves a time required for securing and removing the reinforcing plate to or from the DUT board. Further, since the cam mechanisms which are provided at the corners of the DUT board mounting portion are operated in synchronism with one another, the DUT board can be downwardly pressed while kept horizontally to thereby uniformly press the contact probes. As a result, the DUT board can be stably mounted on the test head.

Although a particular embodiment of the invention has been shown and described, other modifications will occur to those of ordinary skill in the art which call within the scope of the appended claims.

What is claimed is:

1. Apparatus for securing a DUT board assembly, with respect to contact probes on a test head comprising:
    at least one rotatable cam mechanism which is adapted to directly engage with a DUT board assembly so that rotation of said cam mechanism in one direction secures the DUT board assembly to the test head without substantial horizontal motion of the DUT board assembly, allowing portions of the secured DUT board to maintain contact with predetermined contact probes on the test head, and so that rotation of said cam mechanism in a second, opposite direction will release the secured DUT board assembly from said cam mechanism; and
    means for rotating said cam mechanism, whereby a DUT board can be quickly and easily mounted and demounted without the need for mouting and demounting the DUT board to a separate supporter, and with less horizontal displacement than was heretofore possible.

2. Apparatus according to claim 1 wherein a portion of cam mechanism engages with the DUT board assembly, further rotation of said cam mechanism in said direction urges the DUT board assembly against the contact probes.

3. Apparatus according to claim 1 wherein a plurality of said cam mechanisms are provided, and said mechanisms are linked for common actuation.

4. Apparatus according to claim 1 wherein said cam mechanism is adopted to engage a reinforcing plate portion of the DUT board.

5. A contact probe securing apparatus comprising:
    a removable DUT board assembly;
    at least one rotatable cam mechanism which is adapted to directly engage with said DUT board assembly so that rotation of said cam mechanism in one direction secures the DUT board assembly to a test head without substantial horizontal motion of said DUT board assembly, allowing said DUT board assembly to maintain contact with predetermined contact probes on the test head, and so that rotation of said cam mechanism in a second, opposite direction releases said DUT board assembly from said cam mechanism, said removable DUT board assembly being replaced by another of said removable DUT board assembly without dismounting said rotatable cam mechanism.

6. A contact probe securing apparatus according claim 5 wherein said removable DUT board assembly further comprises a DUT board having a plurality of bores and a reinforcing plate having a plurality of bores overlapping said bores on said DUT board and supporting said DUT board, said cam mechanism engaging with said bores on said DUT board and said reinforcing plate.

7. A contact probe securing apparatus according to claim 5 wherein further rotation of said cam mechanism in said direction locks and urges said DUT board assembly against the contact probes.

8. A contact probe securing apparatus according to claim 5 wherein a plurality of said cam mechanisms are provided, and said mechanisms are linked for common actuation.

* * * * *